United States Patent
Sadooghi-Alvandi et al.

(10) Patent No.: US 9,529,950 B1
(45) Date of Patent: Dec. 27, 2016

(54) SYSTEMS AND METHODS FOR PERFORMING PROFILE-BASED CIRCUIT OPTIMIZATION USING HIGH-LEVEL SYSTEM MODELING

(71) Applicant: Altera Corporation, San Jose, CA (US)

(72) Inventors: Maryam Sadooghi-Alvandi, Toronto (CA); Dmitry Nikolai Denisenko, Toronto (CA); Andrei Mihai Hagiescu Miriste, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 14/661,750

(22) Filed: Mar. 18, 2015

(51) Int. Cl.
*G06F 17/00* (2006.01)
*G06F 17/50* (2006.01)

(52) U.S. Cl.
CPC ....... *G06F 17/5045* (2013.01); *G06F 17/5022* (2013.01)

(58) Field of Classification Search
USPC ........................................................ 716/132
See application file for complete search history.

(56) References Cited

U.S. PATENT DOCUMENTS

| | | | |
|---|---|---|---|
| 8,108,194 B2 | 1/2012 | Zhu et al. | |
| 8,683,468 B2 | 3/2014 | Breternitz et al. | |
| 8,782,645 B2 | 7/2014 | Breternitz et al. | |
| 8,806,403 B1 | 8/2014 | Denisenko et al. | |
| 8,818,188 B2 | 8/2014 | Elhage | |
| 2003/0069724 A1* | 4/2003 | Schubert | G01R 31/31835 703/16 |
| 2003/0182642 A1* | 9/2003 | Schubert | G01R 31/31835 716/103 |
| 2004/0098701 A1* | 5/2004 | Klein | G06F 17/5045 716/103 |
| 2004/0123258 A1* | 6/2004 | Butts | G06F 17/5027 716/106 |
| 2005/0010880 A1* | 1/2005 | Schubert | G01R 31/31705 716/106 |

(Continued)

OTHER PUBLICATIONS

Denisenko, U.S. Appl. No. 13/746,518, filed Jan. 22, 2013.

*Primary Examiner* — Mohammed Alam
(74) *Attorney, Agent, or Firm* — Treyz Law Group, P.C.; Michael H. Lyons

(57) ABSTRACT

Integrated circuits may be programmed using configuration data to implement desired custom logic circuits. The configuration data may be generated using a logic design system. The logic design system may include first and second compilers and an emulation engine. The first compiler may compile a computer program language description of the logic circuit to generate a hardware description language (HDL) description. The emulation engine may emulate performance of the logic circuit when loaded on a target device and may monitor the emulated performance to generate emulated profile data characterizing the emulated performance of the logic circuit. The first compiler may process the emulated profile data to identify optimizations to perform on the logic circuit and may compile an optimized HDL description. The second compiler may compile optimized configuration data using the optimized HDL. The design system may generate the optimized configuration data without performing multiple, time-consuming, HDL compilations.

23 Claims, 9 Drawing Sheets

(56) References Cited

U.S. PATENT DOCUMENTS

2006/0031791 A1* 2/2006 Moona ................. G06F 17/505
                                                        716/103
2012/0060059 A1* 3/2012 Johnson ............... G06F 11/263
                                                        714/32
2012/0331278 A1   12/2012 Breternitz et al.

* cited by examiner

SYSTEMS AND METHODS FOR PERFORMING PROFILE-BASED CIRCUIT OPTIMIZATION USING HIGH-LEVEL SYSTEM MODELING

BACKGROUND

This relates to integrated circuits and more particularly, to systems for designing logic circuitry on integrated circuit devices such as programmable integrated circuits.

Programmable integrated circuits are a type of integrated circuit that can be programmed by a user to implement a desired custom logic function. In a typical scenario, a logic designer uses computer-aided design tools to design a custom logic circuit that performs custom logic functions. When the design process is complete, the computer-aided design tools generate configuration data. The configuration data is loaded into memory elements to configure the devices to perform the functions of the custom logic circuit. Memory elements are often formed using random-access-memory (RAM) cells. Because the RAM cells are loaded with configuration data during device programming, the RAM cells are sometimes referred to as configuration memory or configuration random-access-memory cells (CRAM).

Integrated circuits such as programmable integrated circuits often include millions of gates and megabits of embedded memory. The complexity of a large system often requires the use of electronic design automation (EDA) tools to create and optimize a design for the system onto an integrated circuit (target device). Among the procedures performed by EDA tools in a computer aided design (CAD) compilation flow are high-level compilation and hardware description language (HDL) compilation. High-level compilation (or "high-level synthesis") involves generating an HDL file of a system from a computer language description of the system. The computer language description of the system may be, for example, in Open Computing Language (OpenCL) format or another computer language description format. OpenCL is a framework for writing programs that execute across heterogeneous platforms. OpenCL includes a language for writing kernels and application programming interfaces (APIs) that are used to define and control platforms. HDL compilation involves performing synthesis, placement, routing, and timing analysis of the system on the target device and providing final configuration data for the target device to implement the desired system.

Traditionally, synthesis is performed independently of information from other compilations. As a result, the HDL compiler must compile the HDL file without any knowledge of whether the final configuration data performs efficiently or satisfactorily when loaded onto the target device. As a result, the target device may have unoptimized and inefficient performance when loaded with the configuration data.

SUMMARY

An integrated circuit may include memory elements arranged in rows and columns. The integrated circuit may be a programmable integrated circuit that can be programmed (e.g., using configuration data) by a user to implement desired custom logic functions (logic designs or systems). The configuration data may be generated using a logic design system (e.g., logic design equipment).

The logic design system may include logic design computing equipment and may be used to design a logic circuit (e.g., a logical system incorporating a desired logic design) for a target device (e.g., a programmable integrated circuit). The logic design system may include a first, high-level compiler that compiles a computer program language description of the logic circuit to generate a hardware description language (HDL) description file of the logic circuit.

The system may include an emulation engine that models (emulates) performance of the logic circuit identified in the computer program language description (e.g., that models the performance of the target device when the target device is loaded with configuration data specifying the logic design). The emulation engine may receive user input data representative of input data that would be received by the target device when loaded with the logic circuit and may emulate performance of the logic circuit in response to the user input data (e.g., may emulate the performance of the target device when the target device is loaded with configuration data specifying the logic design and when the target device is provided with the user input data).

The emulation engine may monitor the emulated performance of the logic circuit to generate emulated profile data that characterizes the emulated performance of the logic circuit. For example, the emulation engine may include at least one of a loop trip counter, a variable latency instruction monitoring engine, a load store monitoring engine, a block execution monitoring engine, a thread execution monitoring engine, and a barrier monitoring engine that generate the emulated profile data by monitoring the emulated performance of the logic circuit.

The high-level compiler may identify optimizations to the logic design based on the emulated profile data and may generate an optimized HDL description of the logic design incorporating the identified optimizations. The optimized HDL description may be passed to a second compiler.

The second compiler (e.g., an HDL compiler) on the logic design system may generate optimized configuration data for the target device based on the optimized HDL description. For example, the HDL compiler may perform synthesis of the logic circuit. The second compiler may perform placement and route operations and may assemble optimized configuration data that incorporates the optimized logic design identified by the optimized HDL. The optimized configuration data may be provided to a configuration device that programs the target device to implement the optimized logic design described in the optimized configuration data.

The logic design system may be formed on a computer system having memory and a processor that is separate from the target device. The first compiler, the emulation engine, and the second compiler may be stored on the memory (e.g., a non-transitory computer readable medium) and controlled using the processor. In this way, the performance of the target device in implementing desired logic designs may be improved relative to scenarios where no profile data is used to characterize the performance of the logic designs, and the logic design system may generate optimized configuration data for the target device without performing multiple, time-consuming, HDL compilation operations.

Further features of the present invention, its nature and various advantages will be more apparent from the accompanying drawings and the following detailed description.

DETAILED DESCRIPTION

The present invention relates to improving logic circuit compilation and design efficiency when generating efficient logic designs (systems) for a target device using high-level system modeling and emulation. Logic circuit designs that are compiled using the high-level system modeling and emulation may be part of any suitable integrated circuits. Embodiments of the present invention relate to designing and compiling (synthesizing) logic circuitry for integrated circuits and more particularly, integrated circuits with memory elements. Integrated circuits that contain memory elements may include memory chips, digital signal processing circuits, microprocessors, application specific integrated circuits (ASICs), application specific standard products (ASSPs), programmable integrated circuits such as programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), or other suitable integrated circuits.

Integrated circuits such as programmable integrated circuits use programmable memory elements to store configuration data. During programming of a programmable integrated circuit, configuration data is loaded into the memory elements. During normal operation of the programmable integrated circuit, each memory element provides a static output signal. The static output signals that are supplied by the memory elements serve as control signals. These control signals are applied to programmable logic on the integrated circuit to customize the programmable logic to perform a desired logic function.

Memory elements may be organized in arrays having numerous rows and columns. For example, memory array circuitry may be formed in hundreds or thousands of rows and columns on a programmable logic device integrated circuit. Programmable integrated circuit 10 of FIG. 1 is an example of an illustrative integrated circuit on which memory array circuitry may be formed.

Figure 1:
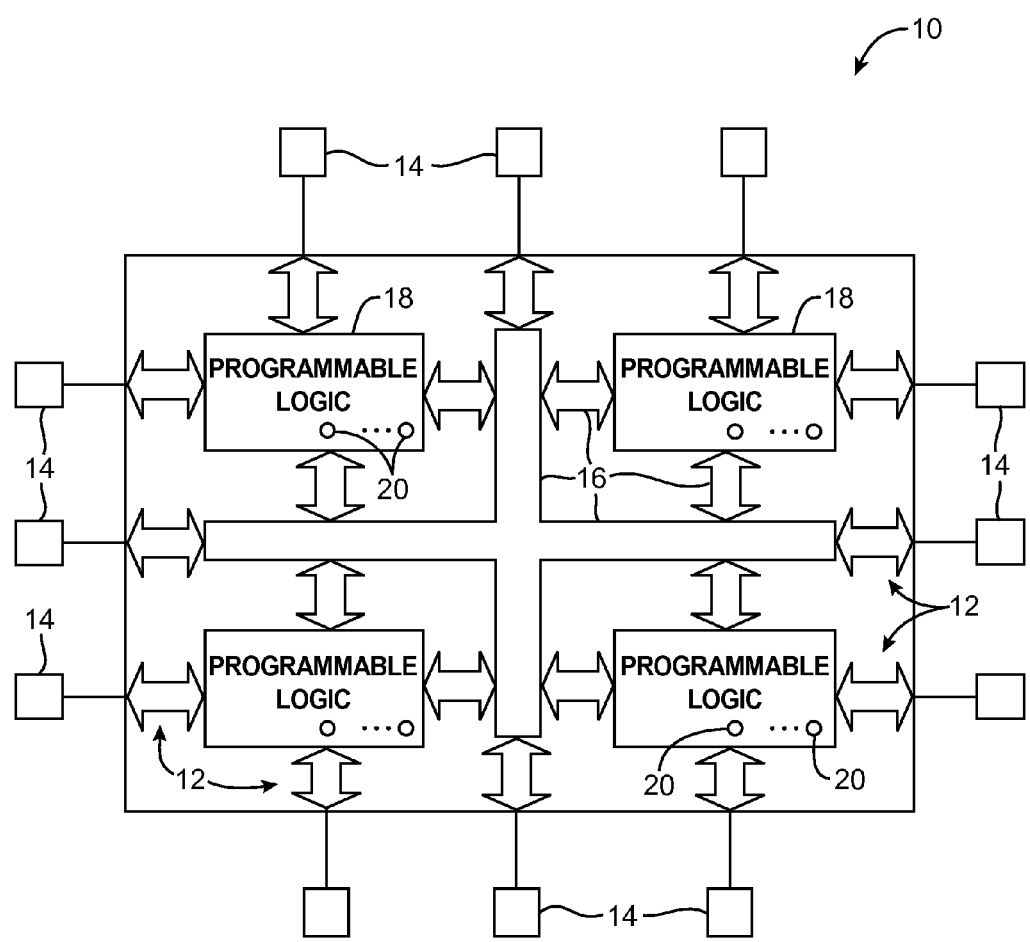
FIG. 1 is a diagram of an illustrative programmable integrated circuit in accordance with an embodiment of the present invention.

As shown in FIG. 1, programmable integrated circuit 10 may have input-output circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Programmable logic 18 may include combinational and sequential logic circuitry. The programmable logic 18 may be configured to perform a custom logic function.

Programmable integrated circuit 10 contains memory elements 20 that can be loaded with configuration data (also called programming data) using pins 14 and input-output circuitry 12. Once loaded, the memory elements each provide a corresponding static control output signal that controls the state of an associated logic component in programmable logic 18. Typically the memory element output signals are used to control the gates of metal-oxide-semiconductor (MOS) transistors. Some of the transistors may be p-channel metal-oxide-semiconductor (PMOS) transistors. Many of these transistors may be n-channel metal-oxide-semiconductor (NMOS) pass transistors in programmable components such as multiplexers. When a memory element output is high, an NMOS pass transistor controlled by that memory element will be turned on to pass logic signals from its input to its output. When the memory element output is low, the pass transistor is turned off and does not pass logic signals.

A typical memory element 20 is formed from a number of transistors configured to form cross-coupled inverters. Other arrangements (e.g., cells with more distributed inverter-like circuits) may also be used. With one suitable approach, complementary metal-oxide-semiconductor (CMOS) integrated circuit technology is used to form the memory elements 20, so CMOS-based memory element implementations are described herein as an example. In the context of programmable integrated circuits, the memory elements store configuration data and are therefore sometimes referred to as configuration random-access memory (CRAM) cells.

Figure 2:
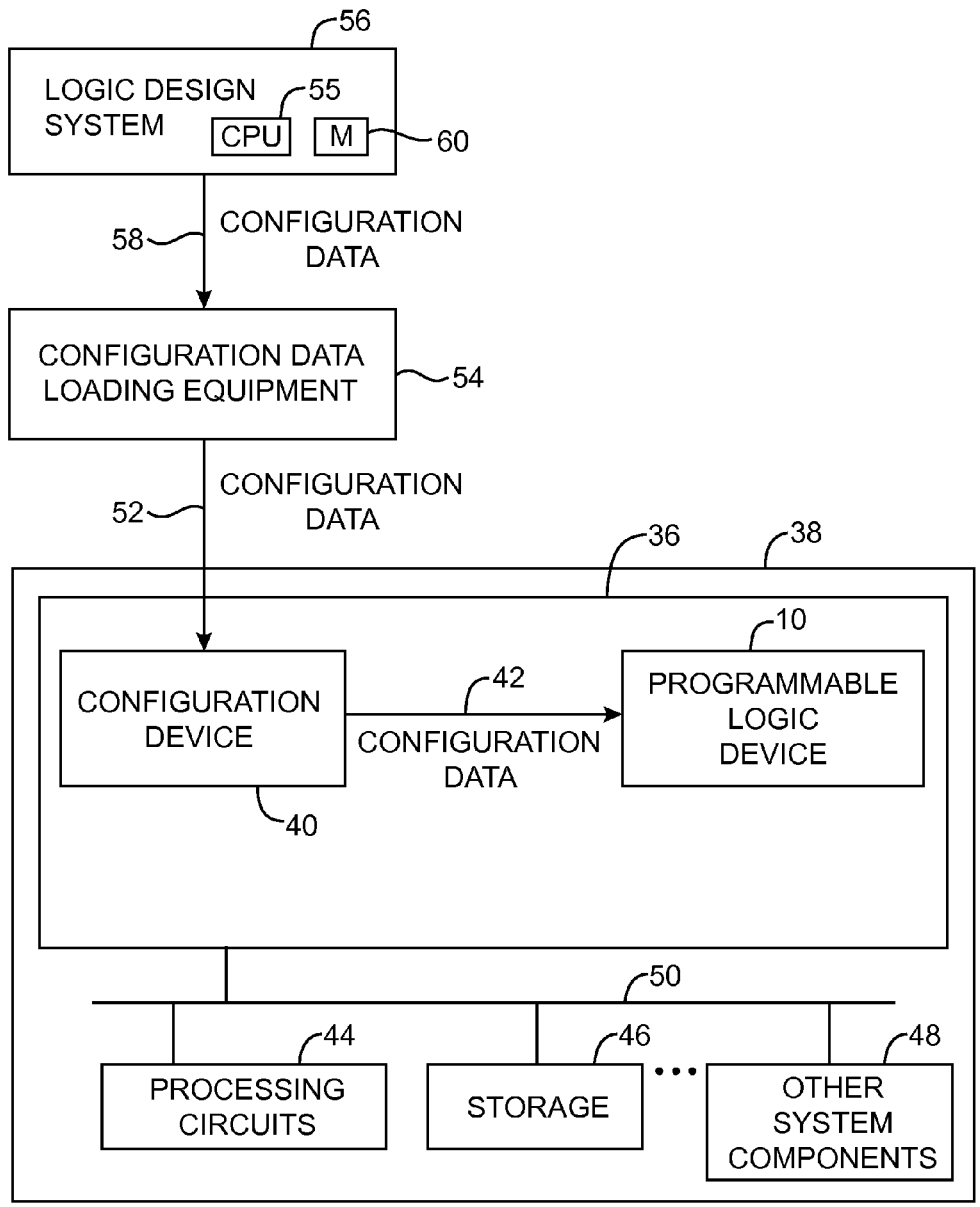
FIG. 2 is an illustrative diagram showing how dynamically optimized configuration data may be generated by a logic design system and loaded into a programmable device to configure the device for operation in a system in accordance with an embodiment of the present invention.

An illustrative system environment for device 10 is shown in FIG. 2. Device 10 may, for example, be mounted on a board 36 in a system 38. In general, programmable logic device 10 may receive configuration data from programming equipment or from other suitable equipment or device. In the example of FIG. 2, programmable logic device 10 is the type of programmable logic device that receives configuration data from an associated integrated circuit 40. With this type of arrangement, circuit 40 may, if desired, be mounted on the same board 36 as programmable logic device 10. Circuit 40 may be an erasable-programmable read-only memory (EPROM) chip, a programmable logic device configuration data loading chip with built-in memory (sometimes referred to as a configuration device), or other suitable device. When system 38 boots up (or at another suitable time), the configuration data for configuring the programmable logic device may be supplied to the programmable logic device from device 40, as shown schematically by path 42. The configuration data that is supplied to the programmable logic device may be stored in the programmable logic device in its configuration random-access-memory elements 20.

System 38 may include processing circuits 44, storage 46, and other system components 48 that communicate with device 10. The components of system 38 may be located on one or more boards such as board 36 or other suitable mounting structures or housings and may be interconnected by buses and other electrical paths 50. If desired, programmable device 10 may be loaded with configuration data without mounting device 10 and/or configuration device 40 to board 36 (e.g., using any desired configuration data loading equipment).

Configuration device 40 may be supplied with the configuration data for device 10 (sometimes referred to herein as target circuit or target device 10) over a path such as path 52. Configuration device 40 may, for example, receive the configuration data from configuration data loading equipment 54 or other suitable equipment that stores this data in configuration device 40. Device 40 may be loaded with data before or after installation on board 36.

It can be a significant undertaking to design and implement a desired (custom) logic circuit in a programmable logic device. Logic designers therefore generally use logic design systems based on computer-aided-design (CAD) tools to assist them in designing circuits. A logic design system can help a logic designer design and test complex circuits for a system. When a design is complete, the logic design system may be used to generate configuration data for electrically programming the appropriate programmable logic device.

As shown in FIG. 2, the configuration data produced by a logic design system 56 (sometimes referred to herein as logic design equipment 56) may be provided to equipment 54 over a path such as path 58. The equipment 54 provides the configuration data to device 40, so that device 40 can later provide this configuration data to the programmable logic device 10 over path 42. System 56 may be based on one or more computers and one or more software programs. System 56 may sometimes be referred to herein as logic design circuitry or data stream generation circuitry. In general, software and data may be stored on any computer-readable medium (storage) in system 56 and is shown schematically as storage 60 in FIG. 2. System 56 may include processing circuitry in the form of one or more processors such as central processing unit (CPU) 55. In general, any desired processing circuitry may be formed on system 56.

In a typical scenario, logic design system 56 is used by a logic designer to create a custom circuit (logic) design. For example, the logic designer may provide input commands to logic design system 56 (e.g., by selecting on screen commands displayed on a display screen, by entering commands using a user input device such as a keyboard, etc.). The system 56 produces corresponding configuration data which is provided to configuration device 40. Upon power-up, configuration device 40 and data loading circuitry on programmable logic device 10 are used to load the configuration data into CRAM cells 20 of device 10. Device 10 may then be used in normal operation of system 38.

Figure 3:
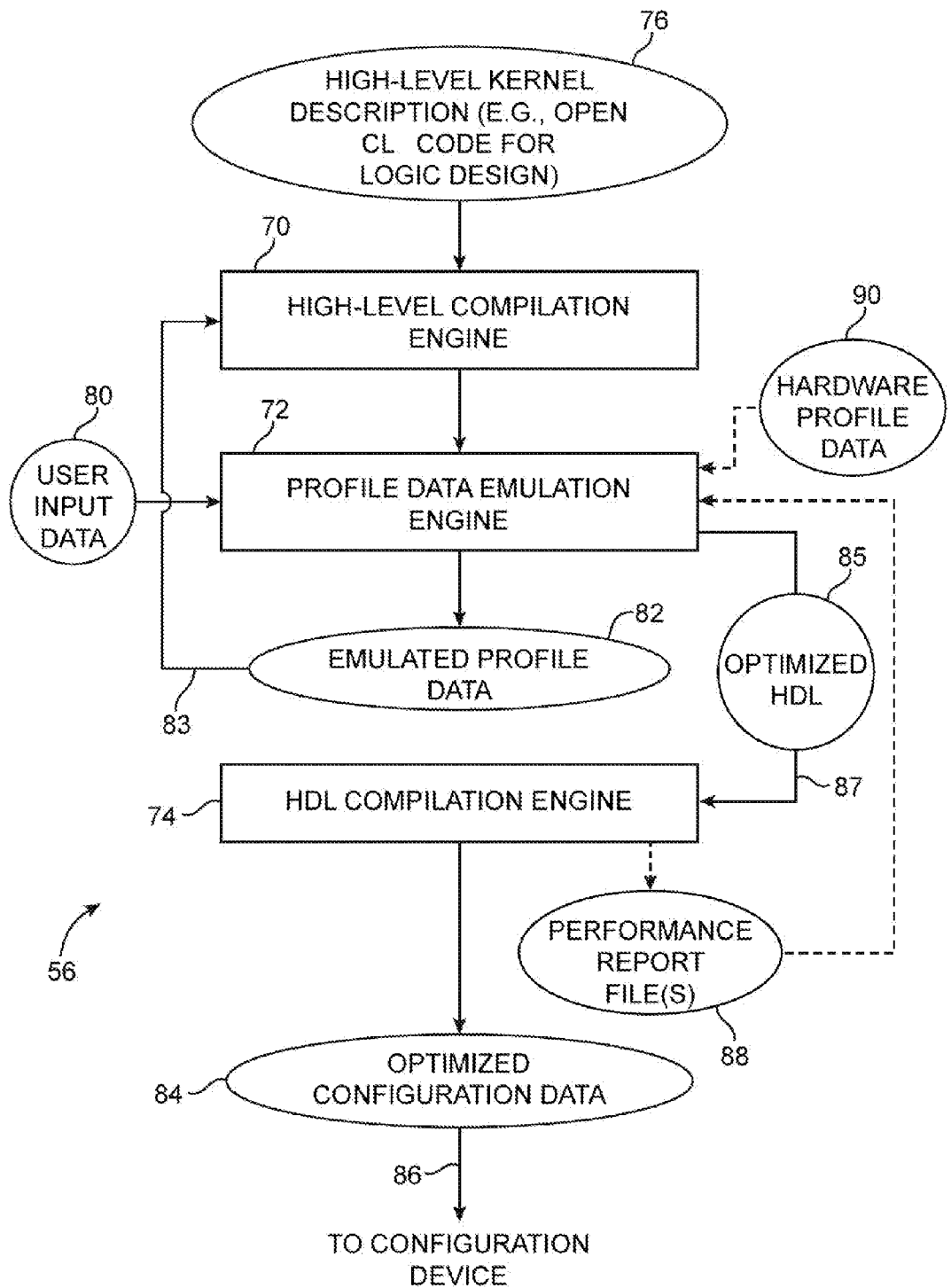
FIG. 3 is a diagram of an illustrative logic design system having an emulation engine for modeling and monitoring the performance of logic designs for an integrated circuit of the type shown in FIG. 1 and that generates optimized configuration data incorporating the modeled logic designs in accordance with an embodiment of the present invention.

FIG. 3 is an illustrative diagram of logic design system 56 for generating configuration data for logic device 10 using high-level system modeling and emulation. Logic device 10 may be a field programmable gate array (FPGA), application specific integrated circuit (ASIC), a structured ASIC, or other device whose functionality is described by a hardware description language (HDL). In accordance with an embodiment of the present invention, the components of logic design system 56 illustrated in FIG. 3 may be performed by one or more computer aided design (CAD)/electronic design automation (EDA) tools implemented on a computer system (e.g., implemented on CPU 55 and/or memory 60).

As shown in FIG. 3, logic design system 56 may include multiple logic compiling engines for performing compilation and synthesis of logic circuit designs for integrated circuit 10 such as high-level compilation engine 70 and Hardware Design Language (HDL) compilation engine 74. High-level compilation (or "high-level synthesis") involves generating an HDL file of a system from a computer language description of the system. The computer language description of the system may be, for example, in Open Computing Language (OpenCL) format or another computer language description format. OpenCL is a framework for writing programs that execute across heterogeneous platforms. OpenCL includes a language for writing kernels and application programming interfaces (APIs) that are used to define and control platforms.

High-level compilation engine 70 (sometimes referred to herein as high-level compiling engine 70 or high-level compiler 70) may receive a high-level kernel description for a desired logic design to be implemented on device 10 such as high-level kernel description 76 (e.g., an OpenCL description 76). High-level kernel description 76 may, for example, be specified by a logic designer (e.g., a user of logic design system 56). High-level kernel description 76 may, for example, be a computer program language (high-level) description of the logic design (system) to implement on device 10 such as an OpenCL description (e.g., OpenCL code) or any other desired program language description.

High-level compilation engine 70 may compile high-level kernel description 76 to generate a hardware description language description of the logic circuit design (e.g., an HDL file, HDL code, or any other desired HDL data structure). This example is merely illustrative and, in general, any desired hardware description may be output by compiler 70. When using a compiler such as compiler 70 to perform high-level compiling of kernel descriptions 76 specifying logic designs for device 10, it may be desirable to gather information about the performance of device 10 when implementing the particular logic design specified by the description 76. Such performance information may include performance metric data that characterizes the performance of device 10 when configured based on description 76 and may sometimes be referred to herein as profile data.

In some scenarios, dedicated hardware may be specified in the HDL file (e.g., by engine 70) for inclusion in the configuration data provided to device 10 that controls device 10 to generate profile data characterizing the performance of device 10 when implementing a particular logic design. The profile data may be generated in response to real user input provided to device 10 (e.g., may characterize the performance of the hardware implemented on device 10 when provided with real user input data). In this scenario, the profile data generated at device 10 may be provided to high-level compilation engine 70, which processes the profile data to determine whether any adjustments to the logic design need to be made to improve performance of device 10 when implementing the desired logic design.

In order to make adjustments to the logic design in response to performance metric information identified by the profile data in this scenario, HDL compilation engine 74 will need to perform an additional HDL compile operation to implement the adjustments before the adjusted configuration data is provided to device 10. However, HDL compilation engine 74 may require an excessive amount of time to perform HDL compilation operations, thereby negatively impacting the efficiency with which device 10 is loaded with optimized configuration data. In other words, at least two, time-consuming, HDL compile operations need to be computed before adjusted (optimized) configuration data is loaded onto the device in this scenario. It may therefore be desirable to provide improved systems and methods for synthesizing and optimizing the logic design to be implemented on device 10.

In order to characterize the performance of device 10 when implementing a desired logic design (e.g., for generating optimized configuration data), logic design system 56 may include a high-level system modeling engine such as profile data emulation engine 72. Emulation engine 72 may receive a user input 80 (e.g., user input corresponding to real user input data that would be provided to device 10 during normal operation of device 10 after configuring device 10 with the configuration data to implement the desired logic design) and may receive high-level kernel description 76 via compiler 70 or other desired paths. Profile data emulation engine 72 may emulate (model) the performance that device 10 would exhibit while implementing the logic design specified by kernel 76 and while provided with a user input such as user input 70. Engine 70 may monitor the performance of the emulated device to generate corresponding emulated profile data 82. In other words, emulation engine 72 may model (emulate) the performance that device 10 would have were device 10 to be configured using the description 76 and provided with a particular user input 80, and emulation engine 72 may generate profile data 82 that would have been generated by device 10 while characterizing the performance of the logic function implemented on device 10.

Profile data emulation engine 72 may pass emulated profile data 82 back to high level compilation engine 70 as shown over path 83. High level compilation engine 70 may compile the logic design identified by description 76 incorporating any desired optimizations as specified by emulated profile data 82 to generate optimized HDL file 85. For example, compilation engine 70 may process emulated profile data 82 to determine how the design for the logic circuitry to implement on device 10 can be adjusted to improve (optimize) the performance of the logic circuitry. Compilation engine 70 may implement the adjustments identified in response to processing emulated profile data 82 when generating optimized HDL data 85 (e.g., engine 70 may optimize the design based on the emulated profile data when generating the optimized HDL data). Engine 70 may pass optimized HDL 85 to HDL compilation engine 74 over path 87.

HDL compilation engine 74 may receive optimized HDL 85 from high-level compilation engine 70 over path 87. HDL compilation engine 74 may compile optimized HDL 85 received from high-level compilation engine 70 to generate optimized configuration data 84 (e.g., an optimized program file). HDL compilation engine 74 may, for example, perform synthesis, placement, routing, and timing analysis of the system for implementation on target device 10.

HDL compilation engine 74 may provide optimized configuration data 84 to configuration device 40 (FIG. 2) as shown by path 86. If desired, HDL compilation engine 74 may optionally provide performance report files 88 associated with the performance of optimized configuration data 84 to high-level compilation engine 70 and high-level compilation engine 70 may receive hardware profile data 90 generated by device 10. By emulating the performance of device 10 and generating corresponding emulated profile data using profile data emulation engine 72, system 56 may characterize the performance of device 10 without a need to form any dedicated logic or hardware on device 10 that generates the profile data on device, thereby allowing for optimized configuration data to be efficiently loaded onto device 10 without the need to iteratively re-compile adjusted HDL files using compilation engine 74.

The example of FIG. 3 is merely illustrative. If desired, high-level compilation engine 70, profile data emulation engine 72, and/or HDL compilation engine 74 may be formed on common circuitry (e.g., on common processing circuitry or a common integrated circuit) or may be formed on dedicated circuits (e.g., engines 70, 72, and 74 may be formed on a common integrated circuits, on separate integrated circuits, etc.). If desired, system 56 may emulate the performance of a host on device 10 in addition to kernels on device 10 (e.g., profile data emulation engine 72 may emulate the performance of description 76 in addition to the performance of a host running on device 10).

In general, kernels may be data processing functions on device 10 (e.g., a data processing function on which a majority of the compute time on device 10 is consumed), whereas hosts may be formed on device 10 to perform one or more control operations. Hosts on device 10 may be implemented on processing circuitry (e.g., one or more CPUs) or, more generally, as one or more state machines. Hosts on device 10 may, for example, pre-process or otherwise convey data to kernels on device 10 for processing, may allocate memory on device 10, provide data from device 10 to external circuitry, synchronize computations by multiple kernels on device 10 or by multiple different devices 10, process or receive user input data, etc. System 56 may emulate the performance of one or more hosts on device 10 and/or kernels on device 10.

Figure 4:
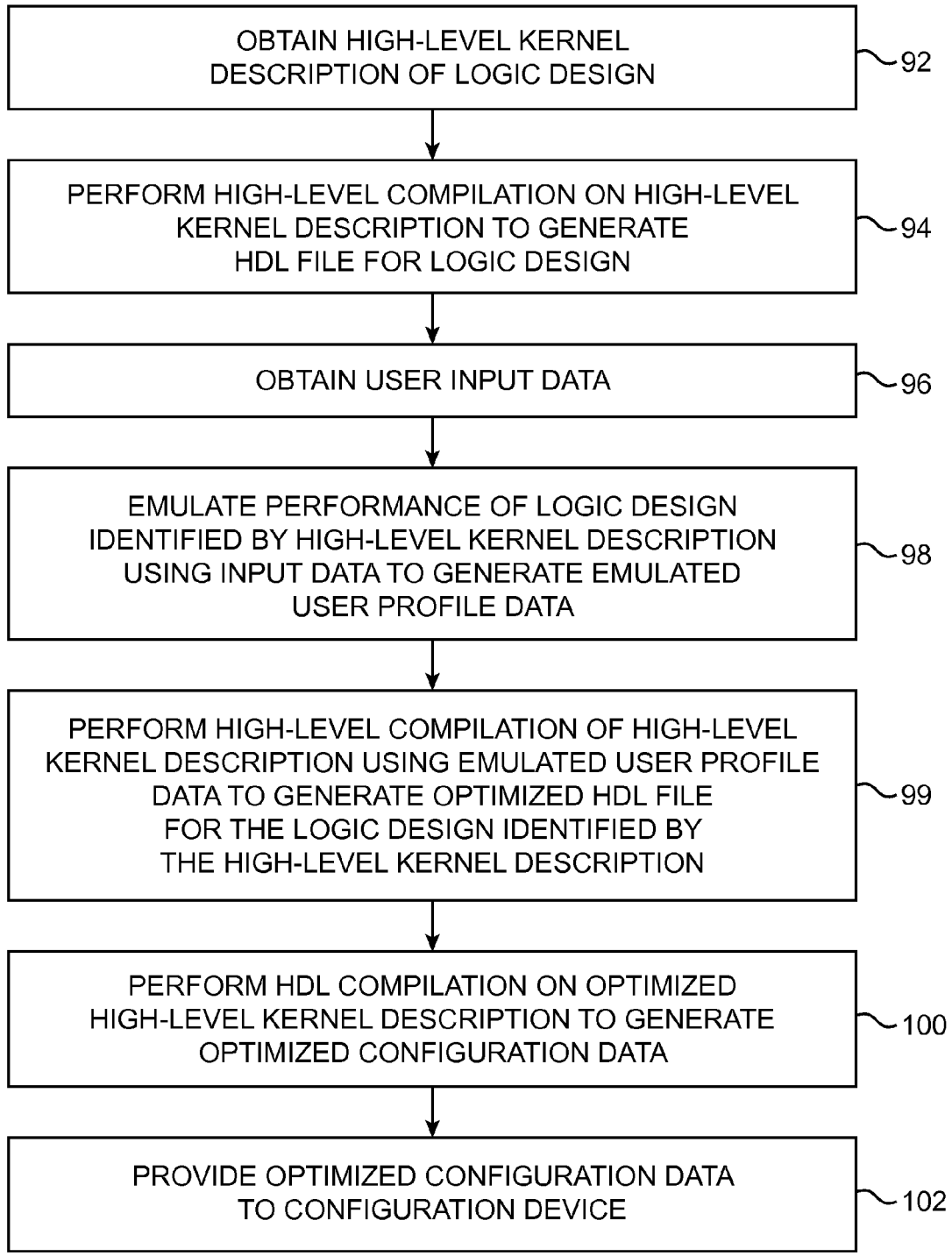
FIG. 4 is a flow chart of illustrative steps for operating a logic design system of the type shown in FIG. 3 to emulate the performance of logic designs for an integrated circuit and for generating optimized configuration data for the integrated circuit based on the emulated performance in accordance with an embodiment of the present invention.

FIG. 4 is a flow chart of illustrative steps that may be performed by logic design system 56 for generating optimized configuration data 84 by emulating the performance of device 10 when loaded with a desired logic design.

At step 92, high-level compilation engine 70 may receive kernel description 76 of a desired logic design (e.g., from a logic designer or user of system 56). The kernel description may, for example, include OpenCL description of the desired logic design for circuitry to be implemented on target device 10. Kernel description 76 may be passed to emulation engine 72.

At step 94, compilation engine 70 may perform high-level compilation on the received high-level kernel description 76 to generate a corresponding HDL file. The HDL file may include hardware description language for the desired logic design identified by kernel description 76. If desired, step 94 may be omitted to perform emulation without additionally performing a high level compiling operation on description 76 without incorporating any logic optimizations At step 96, profile data emulation engine may receive user input data 80. User input data 80 may, for example, be received by a logic designer or user of system 56. User input data 80 may correspond to real input data (e.g., an input data vector) that would be provided to device 10 when implementing the desired logic design. By obtaining user data 80, emulation engine 72 may dynamically emulate the behavior of device 10 in real world conditions (e.g., in conditions when user data is to be input to device 10) to provide a more robust characterization of device 10 than in scenarios where no user data is provided (e.g., static scenarios).

At step 98, emulation engine 72 may emulate the operation of the logic design in received high-level kernel description 76 when provided with user input data 80 (e.g., the performance of device 10 loaded with the logic design when device 10 receives an input corresponding to input data 80). Engine 72 may monitor the emulated performance of the logic design and may generate emulated profile data 82 that includes performance metric data characterizing the performance/behavior of the emulated logic design. The emulated profile data may represent the behavior that device 10 would exhibit when loaded with the logic design (e.g., configuration data that includes the logic design), for example. Emulation engine 72 may provide emulated profile data 82 to high level compilation engine 70 over path 83.

At step 99, high level compilation engine 70 may compile an optimized HDL 85 based on emulated profile data 82 and kernel description 76. For example, compilation engine 70 may identify adjustments to be made to the logic design identified by high level description 76 based on emulated profile data 82 and may compile the logic design of description 76 to include the identified adjustments while generating optimized HDL 85. Optimized HDL 85 may include the identified adjustments. HDL 85 may be passed to HDL compilation engine 74 over path 87.

At step 100, HDL compilation engine 74 may generate optimized configuration data 84 by performing HDL compilation operations on optimized HDL 85. Optimized configuration data 84 may include the identified adjustments to the logic design incorporated in optimized HDL 85. If desired, HDL compilation engine 74 may perform synthesis, placement, routing, and timing analysis when generating optimized configuration data 84.

At step 102, engine 74 may provide optimized configuration data 84 to configuration device 40. Configuration device 40 may subsequently load optimized configuration data 84 so that device 10 implements the desired logic design including any adjustments as identified in emulated profile data 82. In this way, the performance of device 10 in implementing desired logic functions may be improved relative to scenarios where no profile data is used to compile the logic designs for use on device 10, and system 56 may generate optimized configuration data based on the profile data without performing multiple, time-consuming, HDL compilation operations. By emulating a user input 80 in addition to the performance of the logic design in description 76, optimized data 84 may more accurately reflect real world operation of device 10 and may include a dynamic characterization of device 10 relative to scenarios in which user input is not emulated.

The example of FIG. 4 is merely illustrative. In general, profile data emulation engine 72 may emulate the performance of kernel description 76 and/or one or more hosts (e.g., host designs) for device 10. For example, emulation engine 72 may receive information about a host on device 10 for emulating performance of the host in addition to or instead of receiving the output of engine 70 for emulating.

Figure 5:
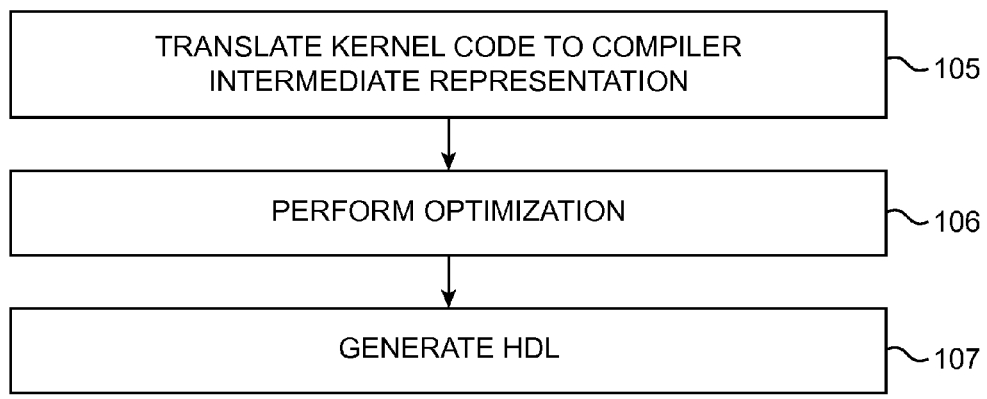
FIG. 5 is a flow chart of illustrative steps that may be performed by a high-level compiling engine in a logic design system of the type shown in FIG. 3 in accordance with an embodiment of the present invention.

FIG. 5 is a flow chart of illustrative steps that may be performed by high-level compilation engine 70 to generate HDL such as optimized HDL 85 using high-level kernel description 76. The steps of FIG. 5 may be performed, for example, while processing steps 94 and/or 99 of FIG. 4.

At step 105, high-level compiler 70 may translate kernel code 76 into a compiler intermediate representation of kernel description 76. The compiler intermediate representation of kernel description 76 may, for example, include a sequence of functions and named data storage. Each function in the compiler intermediate representation may include a sequence of instructions grouped into basic blocks, where each basic block is a contiguous sequence of instructions having a single entry point and a single exit point. An instruction in the middle of a given basic block may be a function call, but may not count as an exit point from the basic block. Each basic block may terminate with either a branch (e.g., a conditional branch) or a return from the function. A barrier synchronization primitive may be expressed as a function call to a special barrier function. The kernel code 76 may include a system description of the eventual hardware target logic system implemented on device 10. If desired, the translation of step 105 may be performed by a compiler front end associated with compiler 70.

At step 106, engine 70 may transform and optimize the compiler intermediate representation generated at step 105 by mapping the intermediate representation to hardware constructs. For example, a Static Single Assignment (SSA) may be used to further restrict the compiler intermediate representation. In SSA, computed values are given a name and the instruction that computes the value is referred to as the value's definition site. A value is computed so that the value can be used by instructions that execute later in the program code and each of those later instructions is known as a use of the value.

If desired, compiler 70 may identify optimizations to perform on the logic design in kernel code 76 based on emulated profile data 82 received from emulation engine 72. For example, compiler 70 may process emulated profile data 82 to determine one or more optimizations to perform on the logic design and/or code description of the logic design.

At step 107, an HDL file such as optimized HDL 85 may be generated for the logic design to be implemented on device 10 (e.g., the logic design identified by kernel 76 and the corresponding intermediate representation). HDL 85 may describe the operation of the system (logic design) to be programmed on target device 10. HDL 85 provides high-level representations of a circuit in terms of the flow of signals (or transfer of data) between hardware registers, and the logic operations performed on those signals. When generating optimized HDL 85, HDL 85 may provide high-level representations of a circuit for the logic design incorporating the optimizations as identified by emulated profile data 82.

Figure 6:
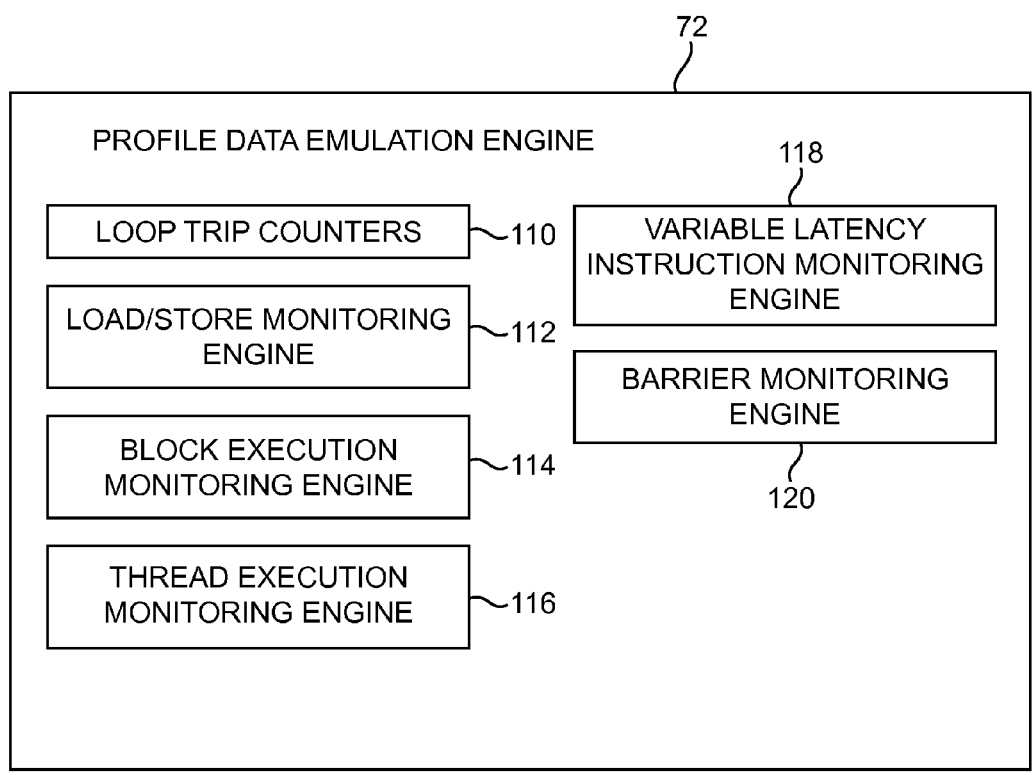
FIG. 6 is an illustrative diagram of an emulation engine having monitoring tools for monitoring the performance of emulated logic designs for an integrated circuit in accordance with an embodiment of the present invention.

FIG. 6 is an illustrative diagram of profile data emulation engine 72 for emulating the operation of a logic design specified by description 76 when a user input 80 is received (FIG. 3). As shown in FIG. 6, emulation engine 72 may include profile tracking (monitoring) engines that generate emulated profile data 82 associated with the emulated performance of the logic design specified by kernel 76 (e.g., that generate emulated profile data 82 while emulating the operation of the logic design specified by kernel 76). For example, emulation engine 72 may include loop trip counters such as loop trip counters 110, load/store monitoring engine 112, block execution monitoring engine 114, thread execution monitoring engine 116, barrier monitoring engine 120, and variable latency instruction monitoring engine 118 that collectively generate emulated profile data 82 based on the system emulated on engine 72 (and any corresponding user input data 80). Engines 110-120 may extract dynamic information about the performance of the emulated device that would otherwise be unavailable to static compilers.

Engines 110-120 may be formed from shared circuitry on emulation engine 72 or from discrete portions (e.g., circuits) of emulation engine 72. The example of FIG. 6 is merely illustrative. In general, one or more of profile tracking engines 110-120 may be omitted and any other desired profile tracking circuitry may be formed on emulation engine 72. Profile tracking engines 110-120 may be specified by a user of design system 56 for monitoring desired emulated operations.

In the example of FIG. 6, loop trip counters 110 on engine 72 may count a number of times a given code loop in the logic design specified by kernel 76 iterates (e.g., may count a number of times counter 110 iterates prior to the loop ending). Counters 110 may maintain count values that are included as a portion of emulated profile data 82.

Load/store monitoring engine 112 may monitor activities of one or more load store units (LSU) emulated using emulation engine 72 (e.g., one or more LSUs identified by kernel 76 that are emulated at engine 72 while modeling how device 10 would perform when implementing the logic design specified by kernel 76). An LSU is an instruction or corresponding hardware implementing an instruction that reads or writes a single value from a specified address in memory. For example, for every emulated LSU, a first counter and a second counter on engine 112 may maintain respective count values reflecting a maximum and a minimum address value accessed by the emulated LSU. A third counter on engine 112 may maintain a count value that reflects a number of cycles the emulated LSU is stalled. A fourth counter on engine 112 may maintain a count value that reflects a number of cycles the emulated LSU is active. A fifth counter on engine 112 may maintain a count value that reflects a number of cycles the emulated LSU is idle. A sixth counter and a seventh counter on engine 112 may maintain respective count values reflective of cache hits and cache misses to the emulated LSUs that access caches.

Counter values generated by each of the counters on engine 112 may be included as a portion of emulated profile data 82. Counter values generated by engine 112 may, for example, be used for cache suitability and size analyses, access pattern analyses, and prefetching analyses when determining whether to adjust the logic design for device 10 (e.g., at HDL compiler 70). If desired, engine 112 may perform range analysis operations on the emulated device to perform aggressive memory dependence removal (e.g., removal of assumed/conservative code dependencies).

Block execution monitoring engine 114 may monitor block execution in the emulated device. A block may, for example, include a set of instructions or hardware implementing the set of instructions with no branching between the set of instructions/hardware. As an example, a counter on engine 114 may generate a count value that reflects how many threads execute a given block or how many times the block is executed. The counter count values maintained by block execution monitoring engine 114 may form a portion of emulated profile data 82.

If desired, block execution monitoring engine 114 may monitor branch probabilities, basic block criticalities, and relative instruction criticality. Monitoring of relative instruction criticality may allow for a finer grained decision on which instructions within blocks to execute than only monitoring block criticality (e.g., than only making decisions about which blocks to execute). Information about branch probabilities, block criticalities, and relative instruction criticality monitored using engine 112 may form a portion of emulated profile data 82.

Thread execution monitoring engine 116 may monitor a number of threads executed by the emulated device. A thread is a set of inputs to a kernel. Monitoring engine 116 may, for example, include a counter that generates a counter value that reflects a number of threads executed. The counter value generated by monitoring engine 116 may form a portion of emulated profile data 82. If desired, thread execution monitoring engine 116 may identify possible thread and iteration divergence points in the emulated device code and may include information about the divergence points as a portion of emulated profile data 82.

If desired, emulation engine 72 may include barrier monitoring engine 120. A barrier is a construct that requires all threads to enter the barrier before any thread can exit the barrier. A simple barrier is used when threads do not use thread identifiers to make control flow decisions. A re-ordering barrier is used when threads do use their identifiers for control flow decisions, allowing threads to enter the barrier out of order. For every re-ordering barrier, a bit may be stored as logic "1" if all instructions enter the re-ordering barrier in order and may be stored as logic "0" if not all instructions enter the re-ordering barrier in order. The bit and/or other desired barrier information may form a portion of emulated profile data 82.

If desired, emulation engine 72 may include a variable-latency instruction monitoring engine 118. A variable-latency instruction is an instruction that may take a variable time to complete, depending on its inputs and the overall state of the system. The monitoring engine may, for example, include counters that track the latency of one or more variable latency instructions. For example, a first counter may generate a counter value reflecting the maximum latency of a variable latency instruction and a second counter may generate a counter value that reflects a minimum latency of the variable latency instruction. The counter values generated by the variable latency instruction monitoring circuitry may form a portion of emulated profile data 82.

The example of FIG. 6 is merely illustrative. In general, any desired profile generating (tracking) engines may be formed on emulator 72 for monitoring the emulated performance of the system to be implemented on device 10. For example, emulation engine 72 may generate statistics and timing analysis identifying critical paths and information such as information about the compiled design such as size and location of components that are included as a portion of emulated profile data 82. Emulation engine 72 may, if desired, generate emulated area values reflecting an area required to implement the system for device 10 and emulated slack values that identify, for each hardware block that corresponds to a single high-level instruction, a worst slack value of a path that goes through the hardware block.

Figure 7:
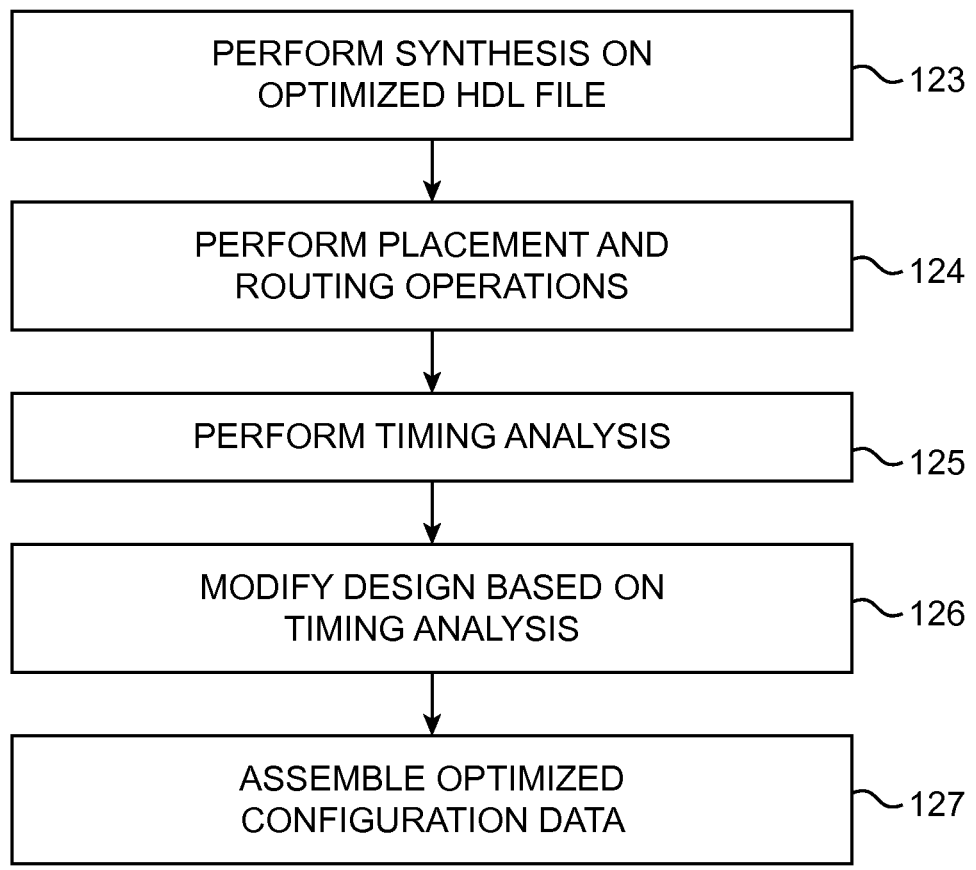
FIG. 7 is a flow chart of illustrative steps that may be performed by a hardware description language compiling engine in a logic design system for generating optimized configuration data in accordance with an embodiment of the present invention.

FIG. 7 is a flow chart of illustrative steps that may be performed by HDL compiler engine 74 of FIG. 3 to generate optimized configuration data 84 based on optimized HDL 85 received from high level compiler 70. The steps of FIG. 7 may, for example, be performed by compiler 74 while processing step 100 of FIG. 4.

At step 123, compiler 74 may synthesize the logic system identified by optimized code 85 (e.g., the HDL file incorporating the identified optimizations as generated while processing step 99 of FIG. 4). Synthesis may include, for example, generating a particular logic design to be implemented by device 10 based on code 85. For example, synthesis may generate a logical representation of the system from the HDL design definition. Synthesis may include mapping the optimized logic design. Mapping may include determining how to implement logic gates and logic elements in the optimized logic representation with specific resources on target device 10. As an example, a netlist may be generated from the mapping. The netlist may be a technology-mapped netlist generated from HDL 85.

At step 124, compiler 74 may perform placement and routing operations on the synthesized logic design. Placement may include placing the mapped and optimized logical system design on target device 10. For example, placement may work on the technology-mapped netlist to produce a placement for each of the functional blocks of the netlist. If desired, placement may include fitting the logical system on target device 10 by determining which resources on logic device 10 are to be used for specific logic elements and other function blocks identified for implementing the system during synthesis. Placement may include clustering, which involves grouping logic elements together to form the logic clusters present on target device 10.

Routing may include allocating routing resources on target device 10 to provide interconnections between logic gates, logic elements, and other components on target device 10. Routability optimization may be performed on the placed logic design, if desired. Routability optimization may reduce the amount of wiring used to connect components in the placed logic design. Routability optimization may include performing fanout splitting, logic duplication, logical rewiring, or other procedures.

At step 125, compiler 74 may perform timing analysis on the placed and routed, optimized, logic design. Timing analysis may determine whether timing constraints of the system are satisfied.

At step 126, compiler 74 may modify the design for the system in response to the timing analysis. For example, compiler 74 may modify the design for the system in response to determining that the timing constraints have not been satisfied by re-performing placement and routing operations, resynthesizing the logic design, or by performing any other desired modifications.

At step 127, compiler 74 may perform assembly operations to assemble optimized configuration data 84 (e.g., including the logic design identified by HDL 85. The assembly operations may include, for example, generating a program file that includes the information determined at steps 123-126. The program file (sometimes referred to herein as an optimized program file) may include optimized configuration data 84 that includes a bit stream used to program target device 10 (e.g., using configuration device 40 of FIG. 2).

In the example of FIG. 7, steps 123-127 may be performed by circuit design tools on logic design system 56. For example, the circuit design tools may be implemented on a first computer system. The optimized data file (e.g., optimized configuration data 84) may be transmitted to configuration device 40 implemented on the first computer system or on a second computer system that is separate from the first computer system. Configuration device 40 may load target device 10 with optimized configuration data 84. By programming device 10 with optimized configuration data 84, components on target device 10 are physically transformed to implement the optimized logic system without needing to generate profile data at device 10 (e.g., using components on device 10) to drive the optimizations to the logic design generated at logic design system 56.

Figure 8:
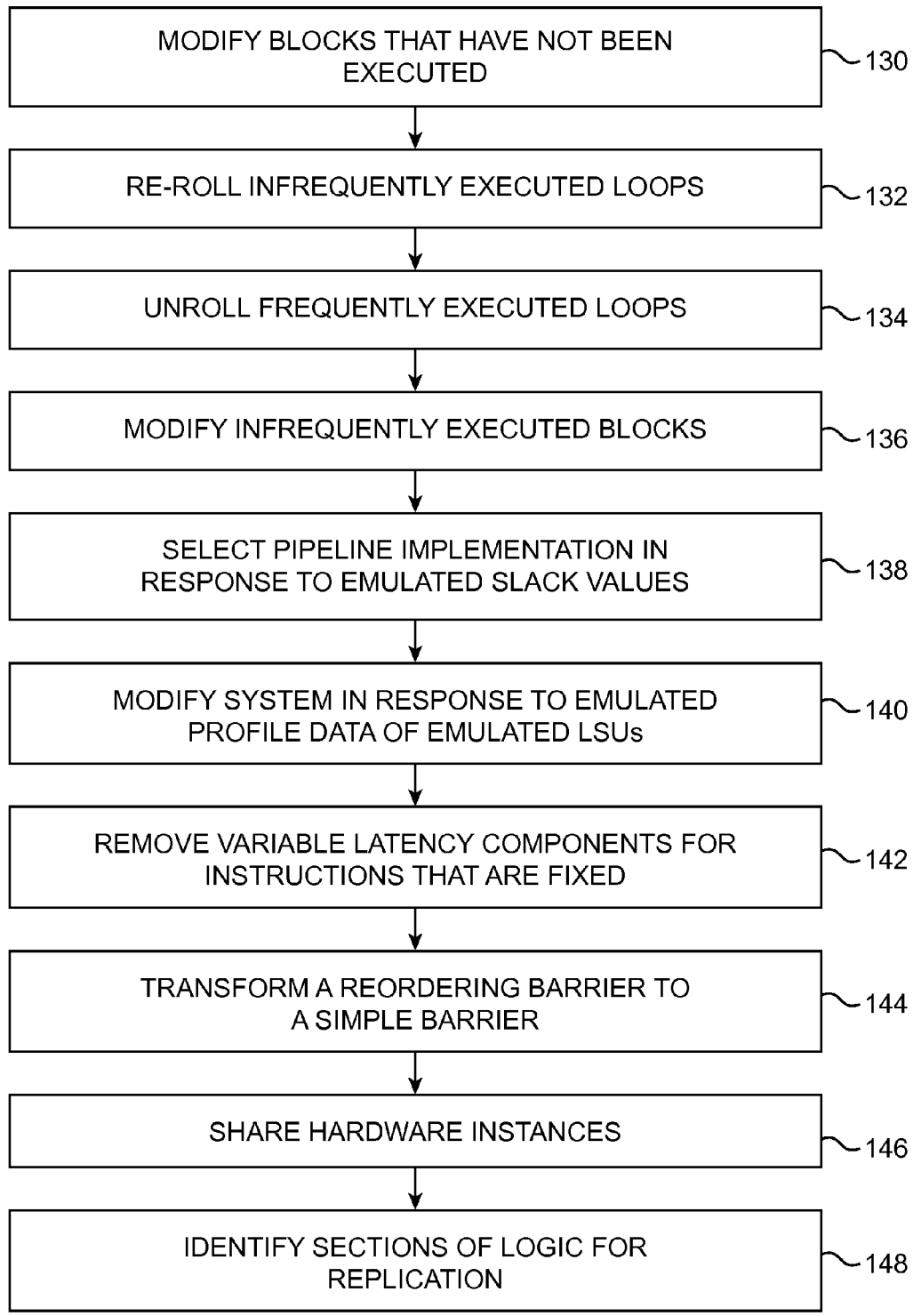
FIG. 8 is a flow chart of illustrative steps that may be performed by a high level compiler to modify a logic design to incorporate optimizations identified based on the emulated performance of the logic design in accordance with an embodiment of the present invention.

FIG. 8 is a flow chart of illustrative steps that may be performed by high level compilation engine 70 of FIG. 3 to identify and perform optimizations to the logic design identified by code 76 based on emulated profile data 82 received from emulation engine 72. The steps of FIG. 8 may, for example, be performed by compiler 70 while processing step 99 of FIG. 7 to identify the logic design optimizations and generate an HDL file 85 of the logic design including the identified optimizations.

Emulated profile data 82 generated by emulator 72 may identify blocks of the logic design in code 76 that were not executed during emulation of the device (e.g., emulator 72 may identify blocks that go unexecuted during the emulation of the device and may indicate those blocks in emulated profile data 82). For example, counter values generated by block execution monitoring engine 114 in emulated profile data 82 may identify blocks of code that were not executed during emulation.

At step 130, engine 74 may modify the blocks in code 76 that are not executed during the emulation for generating optimized HDL 85. For example, engine 74 may implement the unexecuted blocks in an area-efficient manner disregarding any throughput requirements or optimizations. In another suitable arrangement, hardware associated with the unexecuted blocks may be completely removed when generating optimized HDL 85 (FIG. 3). In a scenario where the unexecuted block represents an entire kernel, all sub-blocks within that kernel may be removed, for example.

Emulated profile data 82 may identify loops that are infrequently executed and loops that are frequently executed during emulation of the device. For example, counter values generated by loop trip counters 100 in emulated profile data 82 may identify infrequently executed loops and frequently executed loops. A loop may be identified as being infrequently executed if a counter value for a first block inside the loop body divided by a number of threads executed by the emulated system is less than a predetermined threshold value. A loop may be identified as being frequently executed if a counter value of a first block in the loop body divided by the number of threads executed by the system over a given time is greater than the threshold value.

At step 132, compiler 70 may re-roll the code loops identified by emulated profile data 82 as being infrequently executed. Loop re-rolling transforms two or more consecutive blocks with the same functionality into a loop containing a single block with the same functionality. The resulting loop with the single block will produce the same result as the original two or more blocks that were re-rolled. Re-rolling may also be applied to an existing loop having two or more consecutive blocks with the same functionality. In this scenario, the re-rolling transforms the existing loop by replacing the two consecutive blocks with a single block and increasing the iteration count of the loop to produce the same result.

At step 134, compiling engine 70 may unroll code loops identified in emulated profile data 82 as being frequently executed. Loop unrolling involves fully or partially replacing a loop body with a repeating sequence of blocks that include the original loop body without changing the functionality of the overall program.

Emulated profile data 82 may identify blocks that are infrequently executed during emulation of the device. For example, counter values maintained by block execution engine 114 may identify which blocks are frequently or infrequently executed during emulation of the device.

At step 136, compiler 70 may implement infrequently executed blocks in an area-efficient manner. For example, compiler 70 may pre-compute the beginning of a kernel of an infrequently executed block and may store the pre-computed value in memory. This may remove the area required for the block on the target device 10 and adds an LSU to re-populate the data inside registers on device 10. In another suitable arrangement, a lower-area, higher-latency implementation for the infrequently executed block may be selected.

At step 138, a pipeline implementation is selected in response to the worst emulated slack value associated with a section of the system. For example, for instructions associated with a section of the system having a relatively small emulated slack value (as identified by emulated profile data 82), a higher pipelined implementation is selected for that section. For instructions associated with a section of the system having a relatively large emulated slack value, a lower pipelined implementation may be selected for that section. Pipelining may involve breaking up a hardware implementation of the logic design into multiple stages, each separated by registers. Each stage may execute a computation for a different thread. An instruction implemented with two sets of pipelining registers can process three threads at the same time, for example, whereas an instruction implemented without pipelining can process only a single thread at a time. Determining whether the emulated slack value is small or large may be achieved by comparing the emulated slack value with a predetermined threshold value.

At step 140, compiler 70 may modify the design of the system in response to emulated profile data associated with emulated LSUs. For example, a cache size in optimized HDL 85 may be selected or adjusted in response to emulated profile data on its corresponding LSU. As another example, global and/or local memory architectures may be adjusted in response to the emulated profile data on a corresponding emulated LSU. In this scenario, counter values generated at load/store monitoring engine 112 may be used to determine which global and local memory banks an emulated LSU is accessing. This information may be used to arbitrate networks for the local and global memory, and identify a number of banks and ports to allocate for the local memory. In other examples, compiler 70 may determine which LSUs to alias and may determine which LSUs are used to allocate device memory based on the emulated profile data.

At step 142, compiler 70 may remove control logic associated with a variable latency in a basic block having a fixed latency as identified by emulated profile data 82. For example, a variable latency instruction having a minimum latency equal to a maximum latency may be a fixed latency instruction. The removal of control logic associated with the variable latency allows the system to conserve area and may increase the maximum frequency of the block which leads to improved throughput.

At step 144, compiler 70 may transform a reorder barrier identified by emulated profile data 82 to a simple barrier when instructions enter the reordering barrier in order. By transforming the reordering barrier to a simple barrier, the area for implementing the barrier on target device 10 is reduced.

At step 146, compiler 70 may process emulated profile data 82 to identify instructions in code 76 that are not enabled all of the time and may adjust the code to be implemented in optimized HDL 85 so that the code shares instances of hardware for such instructions. If some instructions are not enabled most of the time, the instructions may share a single hardware instance among multiple calls. Hardware sharing may be achieved by having multiple call sites make request to the hardware instance to perform the computation. The requests are arbitrated to ensure that they are serviced at a rate supported by the hardware instance.

At step 148, compiler 70 may identify sections of logic for replication. Replicating a section of logic is advantageous only if the performance of the section is not limited by access to global memory. The number of copies to replicate the section of logic may be guided by the maximum stall ratio of the emulated LSUs within the section and the hardware area used by the section.

The example of FIG. 8 is merely illustrative. In general, any desired optimizations may be performed by compiler 70 on code 76 for generating optimized HDL 85 based on emulated profile data 82. If desired, one or more of the steps of FIG. 8 may be omitted. The steps of FIG. 8 may be performed in any desired order and/or two or more of the steps may be performed concurrently.

Examples of other optimizations that may be performed at compiler 70 may include, for example, providing an overall throughput report (e.g., as performance report file 88 or other report files) to a user of design system 56. Such reports may guide the user to future code changes that could be made by the user when generating high-level description 76. If desired, compiler 70 may provide the user of design system 56 with an estimate of how code 76 would behave after the optimizations and while implemented on target device 10 (e.g., an estimate of how optimized data 85 would perform when implemented on device 10). If desired, compiler 70 may convert Initiation Interval (II) values in the report to useful feedback for the user of system 56. The performance reports generated by compiler 70 may provide faithful performance information about the logic design for target device 10 after a set of optimizations without the need for time-expensive HDL compiling iterations and extraction of profile data generated at device 10 itself.

If desired, compiler 70 may perform automatic design space exploration for throughput, area, power, and/or latency (e.g., engine 70 may autonomously determine what to optimize in code 76 based on emulated profile data 82 without additional user input). In another suitable arrangement, a user of system 56 may control compiler 70 to perform desired optimizations (some or all of the optimizations shown in FIG. 8 or other optimizations).

If desired, compiler 70 may use emulated profile data 82 to drive automatic partitioning of work across multiple devices 10 (e.g., two or more devices 10 in a multi-device heterogeneous system). For example, compiler 70 may perform optimizations based on emulated profile data 82 by optimizing allocations of kernels onto each of the devices 10 in the multi-device system.

Figure 9:
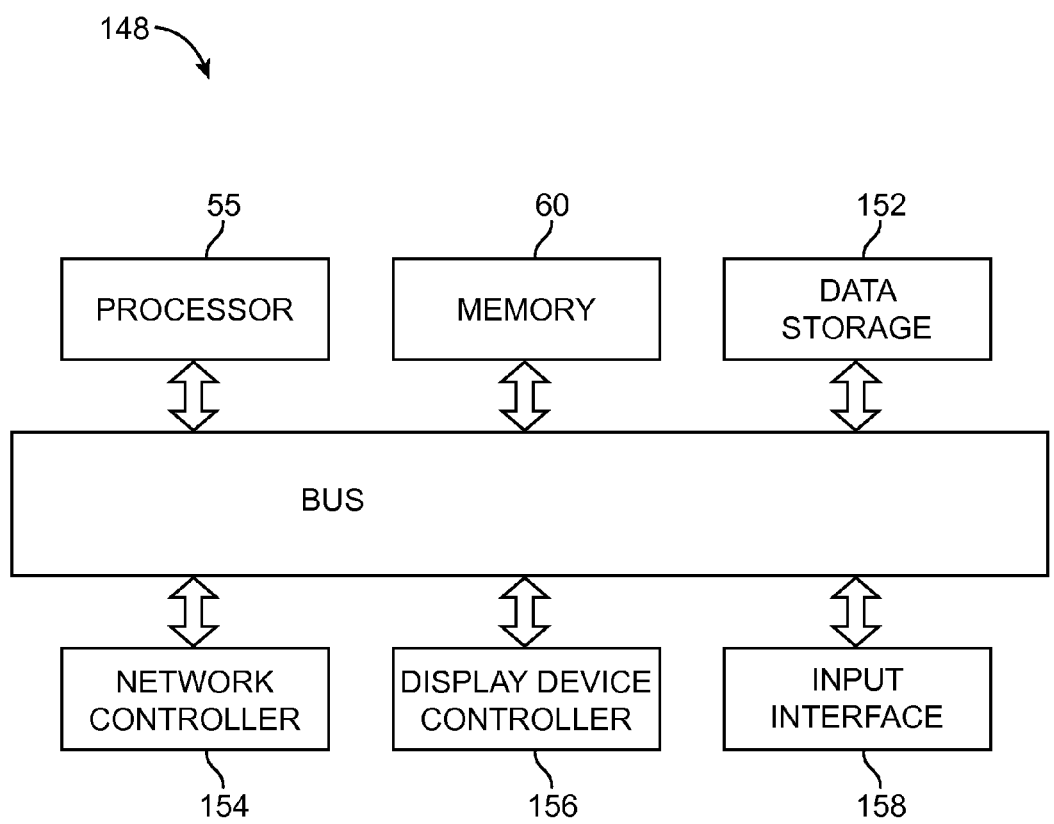
FIG. 9 is a diagram of illustrative computing equipment on which a logic design system of the type shown in FIGS. 2-8 may be formed in accordance with an embodiment of the present invention.

FIG. 9 is an illustrative diagram showing an exemplary computer system 148 on which logic design system 56 is formed (e.g., a logic design system that may be used for generating optimized configuration data 82 without retrieving profile data from device 10 for performing logic design optimizations). Computer system 148 may include processor 55 (e.g., CPU 55 of FIG. 2) that processes data signals. Processor 55 may be coupled to data bus 150 or other switch fabric circuitry that conveys data signals between processor 55 and other components in computer system 148.

Computer system 148 may include memory 60 (e.g., memory 60 as shown in FIG. 2). Memory 60 may store instructions and code represented by data signals that are executed by processor 55. Data storage device 152 may be coupled to bus 150. Data storage device and memory 60 may include, for example, non-volatile memory and/or volatile memory. High-level compiling engine 70, profile data emulation engine 72, and HDL compiling engine 74 of FIG. 3 may reside on memory 60 and/or data storage 152 and may be executed by processor 55, for example.

Computer system 148 may include a network control interface such as network controller 154 coupled to bus 150. Network controller 154 may link computer system 148 to a network of computers (not shown) and may support communication between computers on the network. System 148 may include display circuitry such as display device controller 156 coupled to bus 150. Display controller 156 may allow coupling of a display device (not shown) to computing equipment 148 and may act as an interface between the display device and computing equipment 148. A user input interface such as input interface 158 may be coupled to computer system 148 and may transmit signals (e.g., user input signals or commands) from an input device (not shown) to computer system 148.

The foregoing is merely illustrative of the principles of this invention and various modifications can be made by those skilled in the art without departing from the scope and spirit of the invention. The foregoing embodiments may be implemented individually or in any combination.

What is claimed is:

1. A method of using logic design computing equipment to design a logic circuit for implementing on a target device that is separate from the logic design computing equipment, the method comprising:
    with an emulation engine on the logic design computing equipment, receiving a computer program language description of the logic circuit, modeling performance of the target device when loaded to implement the logic circuit identified by the computer program language description prior to implementing the logic design on the target device, and generating statistics based on the modeled performance of the target device when loaded to implement the logic circuit;
    with a first compiler on the logic design computing equipment, generating an optimized hardware description language (HDL) description of the logic circuit based on the generated statistics;
    with a second compiler on the logic design computing equipment, generating an optimized configuration data bit stream for the target device by compiling the optimized HDL description of the logic circuit; and
    with a configuration device, loading the optimized configuration data bit stream onto the target device, wherein the target device implements the logic circuit as identified by the optimized HDL description when loaded with the optimized configuration data bit stream.

2. The method defined in claim 1, wherein generating the optimized HDL description of the logic circuit comprises compiling an OpenCL description of the logic circuit incorporating optimizations that are identified based on the generated statistics.

3. The method defined in claim 1, wherein generating the optimized HDL description of the logic circuit comprises compiling the computer program language description of the logic circuit incorporating circuit optimizations identified by the generated statistics, and wherein compiling the computer program language description comprises translating a kernel code of the computer program language description to a compiler intermediate representation of the computer program language description.

4. The method defined in claim 1, wherein the second compiler comprises an HDL compiler and wherein generating the optimized configuration data bit stream for the target device comprises:
    performing synthesis of the logic circuit based on the optimized HDL description of the logic circuit.

5. The method defined in claim 4, wherein generating the optimized configuration data bit stream further comprises:
    performing placement and routing operations on the logic circuit subsequent to performing synthesis of the logic circuit.

6. The method defined in claim 1, wherein generating the statistics comprises:
    monitoring code block execution in the modeled performance of the target device when loaded to implement the logic circuit.

7. The method defined in claim 6, wherein generating the optimized HDL description comprises:
    identifying infrequently executed code blocks in the logic circuit based on the monitored code block execution; and
    pre-computing a portion of a kernel of the infrequently executed blocks.

8. The method defined in claim 1, wherein generating the statistics comprises:
    monitoring code thread execution in the modeled performance of the target device when loaded to implement the logic circuit.

9. The method defined in claim 1, wherein generating the statistics comprises:
    monitoring branching probabilities in the modeled performance of the target device when loaded to implement the logic circuit.

10. The method defined in claim 1, wherein generating the statistics comprises:
    monitoring emulated load store units associated with the logic circuit.

11. The method defined in claim 1, wherein generating the statistics comprises:
    monitoring code loop trips in the modeled performance of the target device when loaded to implement the logic circuit.

12. The method defined in claim 11, wherein generating the optimized HDL description of the logic circuit comprises:
    identifying frequently executed code loops and infrequently executed code loops in the logic circuit based on the monitored code loop trips;
    re-rolling the infrequently executed code loops; and
    unrolling the frequently executed code loops.

13. The method defined in claim 1, wherein modeling performance of target device when loaded to implement the logic circuit comprises:
    obtaining user input data and modeling the performance of the target device when loaded to implement the logic circuit based on the obtained user input data and the computer program language description of the logic circuit.

14. A method of operating logic design computing equipment having an emulation engine and a compiling engine to generate a logic design for implementing on an integrated circuit that is separate from the logic design computing equipment, the method comprising:
    with at least one counter on the emulation engine, generating counter values associated with performance of the logic design when implemented on the integrated circuit without configuring the integrated circuit to implement the logic design;
    with the compiling engine, identifying optimizations to be performed on the logic design based on the generated counter values;

with the compiling engine, generating an optimized hardware design language (HDL) description for the integrated circuit that incorporates the identified optimizations;

with an HDL compiling engine on the logic design computing equipment, generating an optimized configuration data bit stream for the integrated circuit by compiling the optimized HDL file; and with the HDL compiling engine, providing the optimized configuration data bit stream to a configuration device that loads the optimized configuration data bit stream onto the integrated circuit, wherein the integrated circuit implements the logic design and incorporates the identified optimizations when loaded with the optimized configuration data bit stream.

15. The method defined in claim 14, further comprising:
with the emulation engine, obtaining input data from a user of the logic design equipment, wherein generating the counter values comprises generating the counter values at least based on the obtained input data.

16. The method defined in claim 14, wherein identifying the optimizations to be performed on the logic design based on the counter values comprises identifying the optimizations to be performed on the logic design without receiving any hardware profile data from the integrated circuit.

17. Logic design computing equipment, comprising:
a first compiler, wherein the first compiler obtains a computer program description language file of a logic design for implementation on a programmable integrated circuit;

a profile data emulation engine, wherein the profile data emulation engine emulates performance of the programmable integrated circuit when the programmable integrated circuit is configured using the logic design without configuring the programmable integrated circuit using the logic design, wherein the profile data emulation engine generates performance metric data that characterizes the emulated performance of the programmable integrated circuit, and wherein the first compiler generates an optimized HDL file of the logic design based on the emulated performance metric data and the computer program description language file; and a second compiler, wherein the second compiler generates an optimized configuration data bit stream by compiling the optimized HDL file, wherein the second compiler transmits the optimized configuration data bit stream to a configuration device that loads the optimized configuration data bit stream onto the programmable integrated circuit, and wherein the programmable integrated circuit implements an optimized logic design identified by the optimized HDL file when loaded with the optimized configuration data bit stream.

18. The logic design equipment defined in claim 17, wherein the logic design computing equipment is formed on a computer system having memory and a processor, wherein the computer system is separate from the programmable integrated circuit, and wherein the first compiler, the profile data emulation engine, and the second compiler are stored on the memory and controlled using the processor.

19. The logic design equipment defined in claim 17, further comprising:
a user input device, wherein the profile data emulation engine gathers user input data from the user input device and emulates the performance of the programmable integrated circuit when the programmable integrated circuit is configured using the logic design and provided with the user input data.

20. The logic design equipment defined in claim 17, wherein the profile data emulation engine comprises circuitry selected from the group consisting of:
a loop trip counter, a variable latency instruction monitoring engine, a load store monitoring engine, a block execution monitoring engine, a thread execution monitoring engine, and a barrier monitoring engine.

21. The logic design equipment defined in claim 17, wherein the logic design comprises a kernel description for the programmable integrated circuit and information about a host for the programmable integrated circuit and the data emulation engine emulates performance of the kernel description and the host for the programmable integrated circuit to generate the performance metric data.

22. The method defined in claim 1, wherein
the second compiler comprises an HDL compiler and wherein generating the optimized configuration data bit stream for the target device comprises, using the HDL compiler:
performing synthesis of the logic circuit based on the optimized HDL description of the logic circuit to generate a synthesized logic circuit;
performing placement and routing operations on the synthesized logic circuit;
performing timing analysis operations on the synthesized logic circuit subsequent to performing the placement and routing operations on the synthesized logic circuit;
modifying the synthesized logic circuit based on the performed timing analysis operations; and
assembling the optimized configuration data bit stream based on the synthesized logic circuit after modifying the synthesized logic circuit.

23. The method defined in claim 14, wherein generating the counter values comprises generating a counter value selected from the group consisting of:
a first counter value reflecting a maximum address value accessed by a load store unit in the logic design that is emulated using the emulation engine, a second counter value reflecting a minimum address value accessed by the load store unit in the logic design that is emulated using the emulation engine, a third counter value reflecting a number of cycles that the load storage unit is stalled in the logic design that is emulated using the emulation engine, a fourth counter value reflecting a number of cycles that the load storage unit is active in the logic design that is emulated using the emulation engine, a fifth counter value reflecting a number of cycles that the load storage unit is idle in the logic design that is emulated using the emulation engine, a sixth counter value reflecting a number of threads that execute a given logic block in the logic design that is emulated using the emulation engine, a seventh counter value reflecting a maximum latency of a variable latency instruction in the logic design that is emulated using the emulation engine, and an eighth counter value that reflects a minimum latency of the variable latency instruction in the logic design that is emulated using the emulation engine.

* * * * *